United States Patent
Ikeno et al.

(10) Patent No.: US 10,256,209 B2
(45) Date of Patent: Apr. 9, 2019

(54) RESIN SUBSTRATE, COMPONENT-MOUNTED RESIN SUBSTRATE, METHOD OF MANUFACTURING RESIN SUBSTRATE, AND METHOD OF MANUFACTURING COMPONENT-MOUNTED RESIN SUBSTRATE

(71) Applicant: Murata Manufacturing Co., Ltd., Nagaokakyo-shi, Kyoto-fu (JP)

(72) Inventors: Keisuke Ikeno, Nagaokakyo (JP); Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/924,305

(22) Filed: Mar. 19, 2018

(65) Prior Publication Data
US 2018/0211934 A1   Jul. 26, 2018

Related U.S. Application Data

(63) Continuation of application No. PCT/JP2016/079210, filed on Oct. 3, 2016.

(30) Foreign Application Priority Data

Oct. 13, 2015 (JP) .................. 2015-201698

(51) Int. Cl.
*H01L 23/48* (2006.01)
*H01L 23/52* (2006.01)
(Continued)

(52) U.S. Cl.
CPC ............ *H01L 24/81* (2013.01); *H01L 21/481* (2013.01); *H01L 21/4853* (2013.01);
(Continued)

(58) Field of Classification Search
CPC ....... H01L 2224/81; H01L 2224/73203; H01L 2224/16225; H01L 2924/15311
(Continued)

(56) References Cited

U.S. PATENT DOCUMENTS 6,204,564 B1 * 3/2001 Miyata ................. H01L 21/563
257/737
7,557,452 B1 * 7/2009 Williams .......... H01L 23/49811
257/697

(Continued)

FOREIGN PATENT DOCUMENTS

JP   2005-123332 A   5/2005
JP   2006-245382 A   9/2006
(Continued)

OTHER PUBLICATIONS

Official Communication issued in International Patent Application No. PCT/JP2016/079210, dated Dec. 20, 2016.

*Primary Examiner* — S. V. Clark
(74) *Attorney, Agent, or Firm* — Keating & Bennett, LLP (57) ABSTRACT

A component-mounted resin substrate includes a thermoplastic resin substrate and an electronic component. The resin substrate includes a surface including a mounting land conductor and a reinforcing resin member. A bump of the electronic component is joined to the mounting land conductor by ultrasonic joining. The reinforcing resin member is in contact with a side surface of the mounting land conductor and has a height smaller than a height of the mounting land conductor.

19 Claims, 10 Drawing Sheets

(51) Int. Cl.
*H01L 29/40* (2006.01)
*H01L 23/00* (2006.01)
*H01L 21/48* (2006.01)
*H01L 23/498* (2006.01)
*H05K 1/11* (2006.01)
*H05K 3/32* (2006.01)
*H01L 23/14* (2006.01)
*H01L 21/56* (2006.01)

(52) U.S. Cl.
CPC .... *H01L 23/4985* (2013.01); *H01L 23/49811* (2013.01); *H01L 23/49838* (2013.01); *H01L 23/49894* (2013.01); *H01L 24/16* (2013.01); *H01L 24/32* (2013.01); *H01L 24/73* (2013.01); *H05K 1/111* (2013.01); *H05K 3/328* (2013.01); *H01L 21/563* (2013.01); *H01L 23/145* (2013.01); *H01L 24/29* (2013.01); *H01L 24/83* (2013.01); *H01L 24/92* (2013.01); *H01L 2224/16225* (2013.01); *H01L 2224/16227* (2013.01); *H01L 2224/2929* (2013.01); *H01L 2224/32225* (2013.01); *H01L 2224/73204* (2013.01); *H01L 2224/81205* (2013.01); *H01L 2224/9211* (2013.01); *H05K 2201/099* (2013.01); *H05K 2201/10674* (2013.01); *H05K 2203/0285* (2013.01)

(58) Field of Classification Search
USPC .................. 257/780, 781, 787; 438/614, 127
See application file for complete search history.

(56) References Cited

U.S. PATENT DOCUMENTS

| | | | |
|---|---|---|---|
| 2002/0089067 A1* | 7/2002 | Crane | H01L 21/563 257/778 |
| 2002/0171157 A1* | 11/2002 | Soga | H05K 3/3484 257/783 |
| 2004/0178486 A1 | 9/2004 | Maeda | |
| 2004/0183210 A1* | 9/2004 | Luo | H01L 23/3114 257/780 |
| 2006/0192298 A1* | 8/2006 | Bauer | H01L 23/49816 257/780 |
| 2008/0036094 A1 | 2/2008 | Yoneda | |
| 2008/0230925 A1* | 9/2008 | Do | H01L 24/11 257/778 |
| 2009/0027864 A1 | 1/2009 | Cho et al. | |
| 2015/0334837 A1 | 11/2015 | Nishida et al. | |
| 2018/0358320 A1* | 12/2018 | Nakamura | H01L 24/73 |

FOREIGN PATENT DOCUMENTS

| | | |
|---|---|---|
| JP | 3855947 B2 | 12/2006 |
| JP | 2009-033084 A | 2/2009 |
| JP | 2014-036160 A | 2/2014 |

\* cited by examiner

RESIN SUBSTRATE, COMPONENT-MOUNTED RESIN SUBSTRATE, METHOD OF MANUFACTURING RESIN SUBSTRATE, AND METHOD OF MANUFACTURING COMPONENT-MOUNTED RESIN SUBSTRATE

CROSS REFERENCE TO RELATED APPLICATIONS

This application claims the benefit of priority to Japanese Patent Application No. 2015-201698 filed on Oct. 13, 2015 and is a Continuation Application of PCT Application No. PCT/JP2016/079210 filed on Oct. 3, 2016. The entire contents of each application are hereby incorporated herein by reference.

BACKGROUND OF THE INVENTION

1. Field of the Invention

The present invention relates to a resin substrate that is made of a material having flexibility and that includes a surface onto which a component is to be mounted and a component-mounted resin substrate defined by the resin substrate on which a component has been mounted.

2. Description of the Related Art

In the related art, component-mounted resin substrates have often been used in various electronic devices. Such a component-mounted resin substrate includes a resin substrate and an electronic component. The electronic component is mounted on the resin substrate.

For example, in the configuration described in Japanese Patent No. 3855947, a semiconductor bare chip is mounted on a surface of a flexible wiring board having thermoplasticity. The semiconductor bare chip is joined to the flexible wiring board by ultrasonic joining.

In the case of a flexible wiring board having thermoplasticity, it is difficult to use a joining method such as, for example, reflow soldering that is performed by heating the entire board. This is because, if a joining method that is performed by heating the entire board is used, there is a probability that the flexible wiring board will soften or melt and will become deformed.

Even in the case of ultrasonic joining, which is not a joining method that is performed by heating the entire flexible wiring board, the flexible wiring board will partially soften due to the frictional heat generated during the ultrasonic joining and will be likely to be deformed. In addition, ultrasonic vibration is dispersed due to the flexibility of the flexible wiring board, and this makes it difficult to perform ultrasonic joining that provides a sufficient joint strength. As a result, a joint defect is likely to occur.

SUMMARY OF THE INVENTION

Preferred embodiments of the present invention provide resin substrates to which electronic components are joined with greater certainty, and provide component-mounted resin substrates that include resin substrates and electronic components.

A resin substrate according to a preferred embodiment of the present invention includes a resin body having thermoplasticity, a mounting land conductor provided on a side of a surface of the resin body, and a reinforcing resin member that is provided on the surface of the resin body. The reinforcing resin member is in contact with at least a portion of a side surface of the mounting land conductor and has a height smaller than a height of the mounting land conductor. The mounting land conductor has a tapered shape in which a bottom surface of the mounting land conductor has a width larger than a width of a top surface of the mounting land conductor when viewed from a side. A portion of the mounting land conductor on a side of the bottom surface is embedded in the resin body, and a portion of the mounting land conductor on a side of the top surface is not embedded in the resin body.

With this configuration, the reinforcing resin member reduces or prevents deformation of the resin substrate when a bump is joined to the mounting land conductor by ultrasonic joining. In addition, with this configuration, the contact area between the reinforcing resin member and the side surface of the mounting land conductor is larger than that in the case in which the side surface is perpendicular or substantially perpendicular to the top and bottom surfaces of the mounting land conductor. As a result, a reinforcing effect is improved.

It is preferable that, in a resin substrate according to a preferred embodiment of the present invention, the reinforcing resin member be made of a material that is harder than the resin body.

With this configuration, deformation of the resin substrate is further reduced or prevented.

In addition, it is preferable that a resin substrate according to a preferred embodiment of the present invention have the following configuration. The mounting land conductor includes a plurality of mounting land conductors that are spaced apart from each other. The reinforcing resin member has a shape that causes the reinforcing resin member to be in contact with portions of the side surfaces of adjacent mounting land conductors, the portions facing each other.

With this configuration, deformation of the resin substrate is reduced or prevented, and in addition, the probability that the positional relationship between the mounting land conductors that are adjacent to each other change is reduced.

In addition, it is preferable that, in a resin substrate according to a preferred embodiment of the present invention, the reinforcing resin member be provided on only a portion of the surface of the resin body so as to fill space between all of the plurality of mounting land conductors at the surface of the resin substrate and so as to be in contact with the entire side surfaces of all of the plurality of mounting land conductors.

With this configuration, deformation of the resin substrate is reduced or prevented, and in addition, the probability that the positional relationship between all of the mounting land conductors, to which all of the bumps of an electronic component are to be joined, changes is reduced.

Furthermore, it is preferable that, in a resin substrate according to a preferred embodiment of the present invention, the reinforcing resin member be provided on only a portion of the surface of the resin body so as to fill space between all of the plurality of mounting land conductors at the surface of the resin body and so as to extend over an entire minimum region with corner portions or a portion of sides of the minimum region being defined by portions of the side surfaces of the plurality of mounting land conductors to which bumps of an electronic component are to be joined.

With this configuration, the formation area of the reinforcing resin member is small.

A resin substrate according to another preferred embodiment of the present invention includes a resin body having thermoplasticity, a plurality of mounting land conductors provided on a surface of the resin body, and a reinforcing resin member that is provided on only a portion of the surface of the resin body. The reinforcing resin member is in contact with at least a portion of a side surface of each of the mounting land conductors and has a height smaller than a height of each of the mounting land conductors. The plurality of mounting land conductors are spaced apart from each other. The reinforcing resin member fills a space between all of the plurality of mounting land conductors on the surface of the resin body and extends over an entire minimum region in which corner portions or a portion of sides of the minimum region are defined by portions of the side surfaces of the plurality of mounting land conductors to which bumps of an electronic component are to be joined.

It is preferable that, in a resin substrate according to a preferred embodiment of the present invention, the reinforcing resin member be made of a material that is harder than the resin body. With this configuration, deformation of the resin substrate is further reduced or prevented.

A component-mounted resin substrate according to another preferred embodiment of the present invention includes the resin substrate according to any one of the above-described preferred embodiments of the present invention, and an electronic component including a bump that is joined to the mounting land conductor by ultrasonic joining.

With this configuration, deformation of portions of the resin body, which include the mounting land conductors, during a joining process is reduced or prevented, and the joint reliability between the electronic component and the resin body is improved.

It is preferable that a component-mounted resin substrate according to a preferred embodiment of the present invention include an underfill resin that is injected into a space between the electronic component and a surface of the resin substrate.

With this configuration, the joint reliability between the electronic component and the resin body is further improved.

It is preferable that a method of manufacturing a resin substrate according to another preferred embodiment of the present invention include forming a mounting land conductor on a surface of one of a plurality of resin layers each having thermoplasticity, the mounting land conductor having a tapered shape in which a bottom surface of the mounting land conductor has a width larger than a width of a top surface of the mounting land conductor when viewed from a side, forming a resin body in which a portion of the mounting land conductor on a side of the bottom surface is embedded and in which a portion of the mounting land conductor on a side of the top surface is not embedded, by stacking the plurality of resin layers on top of one another while the resin layer on which the mounting land conductor has been formed defines the uppermost layer, and forming a reinforcing resin member on a surface of the resin body so as to be in contact with a side surface of the mounting land conductor and so as to have a height smaller than a height of the mounting land conductor.

It is preferable that a method of manufacturing a component-mounted resin substrate according to another preferred embodiment of the present invention include forming a mounting land conductor on a surface of one of a plurality of resin layers each having thermoplasticity, the mounting land conductor having a tapered shape in which a bottom surface of the mounting land conductor has a width larger than a width of a top surface of the mounting land conductor when viewed from a side, forming a resin body in which a portion of the mounting land conductor on a side of the bottom surface is embedded and in which a portion of the mounting land conductor on a side of the top surface is not embedded, by stacking the plurality of resin layers on top of one another while the resin layer on which the mounting land conductor has been formed defines the uppermost layer, forming a reinforcing resin member on a surface of the resin body so as to be in contact with a side surface of the mounting land conductor and so as to have a height smaller than a height of the mounting land conductor, and joining a bump of an electronic component to the mounting land conductor by ultrasonic joining.

It is preferable that a method of manufacturing a component-mounted resin substrate according to another preferred embodiment of the present invention include forming a mounting land conductor on a surface of one of a plurality of resin layers each having thermoplasticity, the mounting land conductor having a tapered shape in which a bottom surface of the mounting land conductor has a width larger than a width of a top surface of the mounting land conductor when viewed from a side, forming a resin body in which a portion of the mounting land conductor on a side of the bottom surface is embedded and in which a portion of the mounting land conductor on a side of the top surface is not embedded, by stacking the plurality of resin layers on top of one another while the resin layer on which the mounting land conductor has been formed defines the uppermost layer, forming a reinforcing resin member on a surface of the resin body so as to be in contact with a side surface of the mounting land conductor and so as to have a height smaller than a height of the mounting land conductor, and joining a bump of an electronic component to the mounting land conductor with an anisotropic conductive film interposed between the bump and the mounting land conductor.

In the above-described manufacturing methods, deformation of the resin substrate when the bump of the electronic component is joined to the mounting land conductor is reduced or prevented by the reinforcing resin member.

According to preferred embodiments of the present invention, resin substrates on which electronic components are able to be mounted with higher certainty and component-mounted resin substrates in which the joint reliability between the electronic components and the resin substrates is high are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
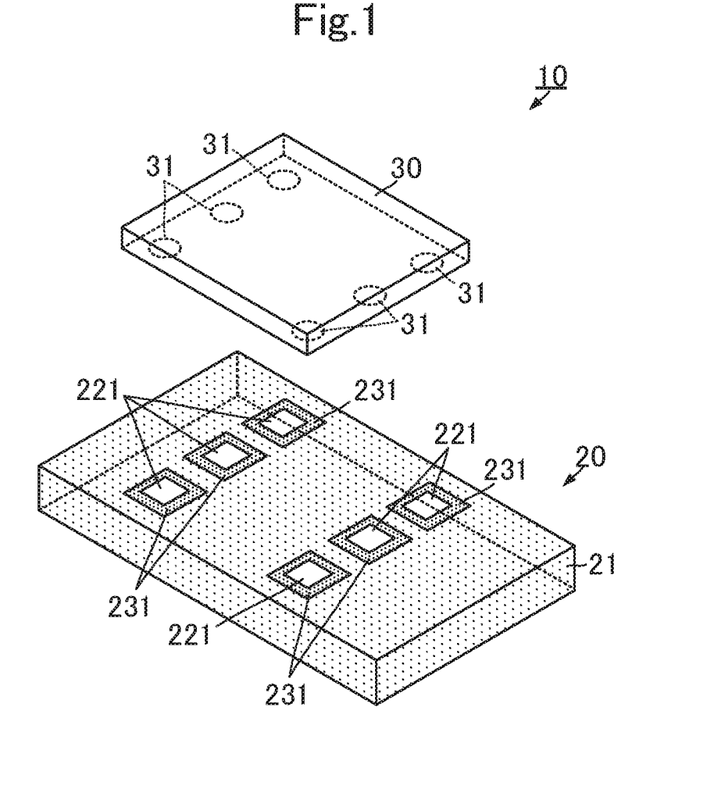
FIG. 1 is an exploded perspective view of a component-mounted resin substrate according to a first preferred embodiment of the present invention.
Figure 2:
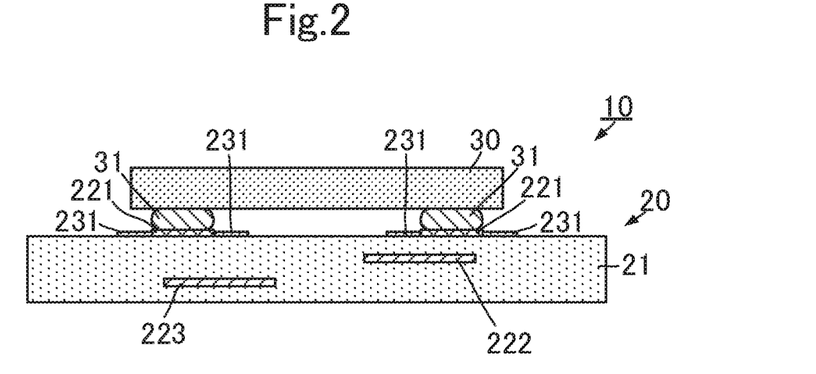
FIG. 2 is a sectional view illustrating the structure of the component-mounted resin substrate according to the first preferred embodiment of the present invention.
Figure 3A:
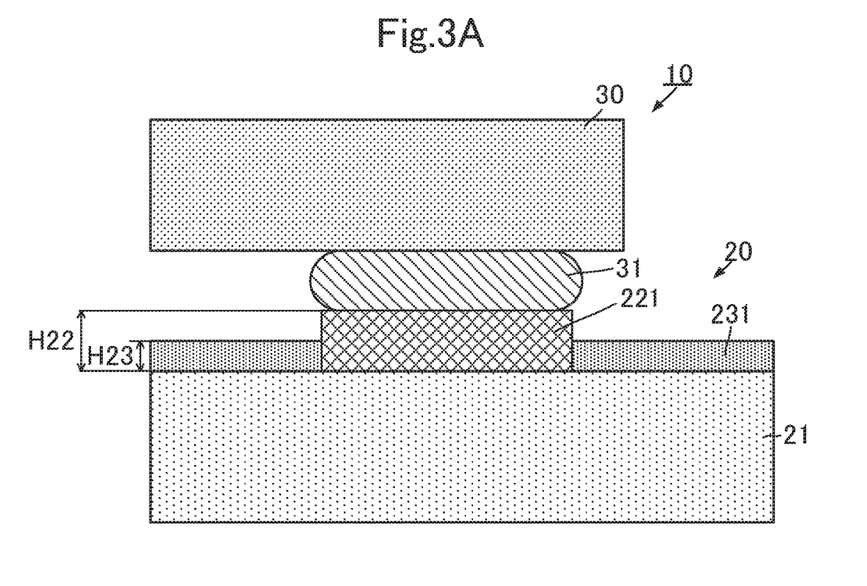
FIG. 3A is an enlarged sectional view of the component-mounted resin substrate according to the first preferred embodiment of the present invention.
Figure 3B:
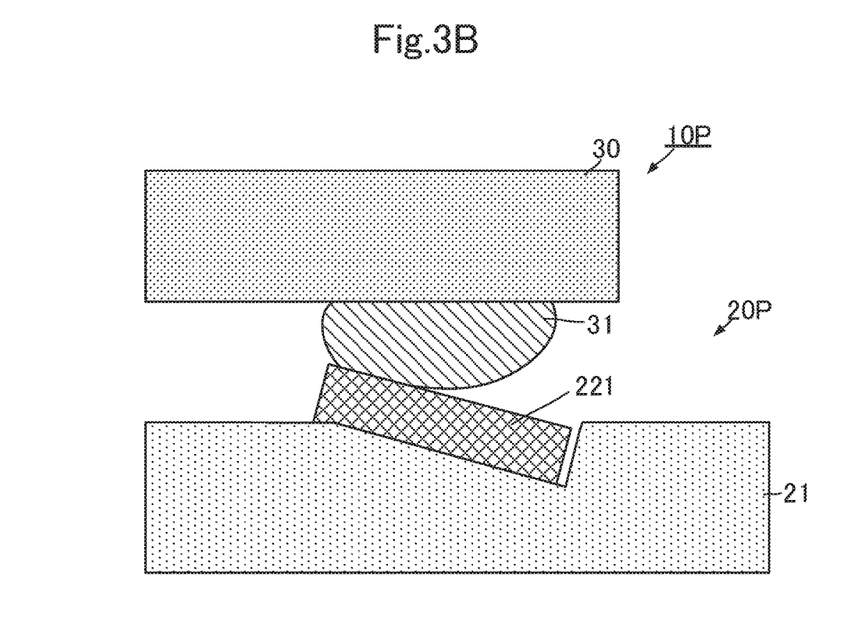
FIG. 3B is an enlarged sectional view of a component-mounted resin substrate of the related art.

Resin substrates, component-mounted resin substrates, methods of manufacturing resin substrates, and methods of manufacturing component-mounted resin substrates according to preferred embodiments of the present invention will be described with reference to the drawings. FIG. 1 is an exploded perspective view of a component-mounted resin substrate according to a first preferred embodiment of the present invention. FIG. 2 is a sectional view illustrating the structure of the component-mounted resin substrate according to the first preferred embodiment of the present invention. FIG. 3A is an enlarged sectional view of the component-mounted resin substrate according to the first preferred embodiment of the present invention. FIG. 3B is an enlarged sectional view of a component-mounted resin substrate of the related art.

As illustrated in FIG. 1, a component-mounted resin substrate 10 includes a resin substrate 20 and an electronic component 30. The resin substrate 20 includes a resin body 21, a plurality of mounting land conductors 221, inner-layer conductor patterns 222 and 223, and a plurality of reinforcing resin members 231.

The resin body 21 is made of a material having thermoplasticity. For example, the resin body 21 preferably includes a liquid crystal polymer as a main material. The inner-layer conductor patterns 222 and 223 are embedded in the resin substrate 20 and are conductor patterns defining a circuit in the resin substrate 20.

The plurality of mounting land conductors 221 are provided on a surface (mounting surface) of the resin body 21. The plurality of mounting land conductors 221 are conductor patterns each preferably having a rectangular or substantially rectangular shape, for example. The plurality of mounting land conductors 221 are provided in an arrangement pattern corresponding to an arrangement pattern of terminal conductors (bumps 31) of the electronic component 30 that is mounted onto the resin body 21.

The plurality of reinforcing resin members 231 are provided on the surface of the resin body 21. The number of the reinforcing resin members 231 and the number of the mounting land conductors 221 are preferably the same.

The plurality of reinforcing resin members 231 are structured such that each of the reinforcing resin members 231 surrounds a corresponding one of the mounting land conductors 221 when the resin body 21 is viewed in plan view (when viewed in a direction perpendicular or substantially perpendicular to the surface of the resin body 21). In other words, the reinforcing resin members 231 are individually provided for the corresponding mounting land conductors 221.

As illustrated in FIG. 3A, the reinforcing resin members 231 are in contact with the side surfaces of the corresponding mounting land conductors 221. Each of the reinforcing resin members 231 has a height H23, and each of the mounting land conductors 221 has a height H22, the height H23 being smaller than the height H22 (H23<H22).

The electronic component 30 is preferably, for example, a semiconductor chip or other suitable component and includes the plurality of terminal conductors (not illustrated) provided on a surface of a housing thereof. The bumps 31 are provided on the terminal conductors.

As illustrated in FIG. 2 and FIG. 3A, the electronic component 30 is mounted on the resin substrate 20 such that each of the bumps 31 is joined to a corresponding one of the mounting land conductors 221. The electronic component 30 is mounted on the resin substrate 20 by ultrasonic joining.

Here, since the resin body 21, which is included in the resin substrate 20, has thermoplasticity, when the electronic component 30 is mounted on the resin substrate 20 by ultrasonic joining, frictional heat causes the resin body 21 to soften. Consequently, in the case in which the reinforcing resin members 231 are not provided, portions of the mounting land conductors 221 are embedded into the resin body 21 as illustrated in FIG. 3B, and there is a case in which the state of the bumps 31 and the corresponding mounting land conductors 221 joined to each other becomes unfavorable, and a joint defect is likely to occur.

However, in the resin substrate 20 according to the first preferred embodiment, since the reinforcing resin members 231 are in contact with the side surfaces of the corresponding mounting land conductors 221, portions of the resin substrate 20, the portions being covered with the mounting land conductors 221 and the reinforcing resin members 231, have an increased strength. Thus, even if the frictional heat generated when the bumps 31 are joined to the corresponding mounting land conductors 221 propagates to the resin body 21, the mounting land conductors 221 are less likely to be embedded into the resin body 21 and are less likely to become inclined. Therefore, the probability of the occurrence of a joint defect when the electronic component 30 is mounted onto the resin substrate 20 is significantly reduced or prevented.

Note that, although it is preferable that the height H23 of each of the reinforcing resin members 231 be as close as possible to the height H22 of each of the mounting land conductors 221, the height H23 of each of the reinforcing resin members 231 is set to be smaller than the height H22 of each of the mounting land conductors 221. In addition, the reinforcing resin members 231 do not cover surfaces of the mounting land conductors 221 (the surfaces to which the bumps 31 are to be joined). With such a configuration, the influence of softening caused by heat generated during a joining process is able to be reduced, and large interfaces between the bumps 31 and the corresponding mounting land conductors 221 are ensured, so that the joint reliability is improved.

Although each of the reinforcing resin members 231 may be in contact with at least one of the side surfaces of the corresponding mounting land conductor 221, it is preferable that each of the reinforcing resin members 231 be in contact with all of the side surfaces of the corresponding mounting land conductor 221. As a result of each of the reinforcing resin members 231 being in contact with all of the side surfaces of the corresponding mounting land conductor 221, the effect of reducing the probability that the mounting land conductors 221 will be embedded into the resin body 21 or will become inclined is improved.

The reinforcing resin members 231 are made of, for example, an epoxy resin. It is preferable that the reinforcing resin members 231 be made of a thermosetting resin, for example, and it is preferable that the reinforcing resin members 231 be made of a material that is harder than the resin body 21 in a state where frictional heat is applied to the material. As a result, the effect of reducing the probability that the mounting land conductors 221 will be embedded into the resin body 21 or will become inclined is improved. Note that, in the present application, the term "harder" refers to having a higher Young's modulus.

Figure 4:
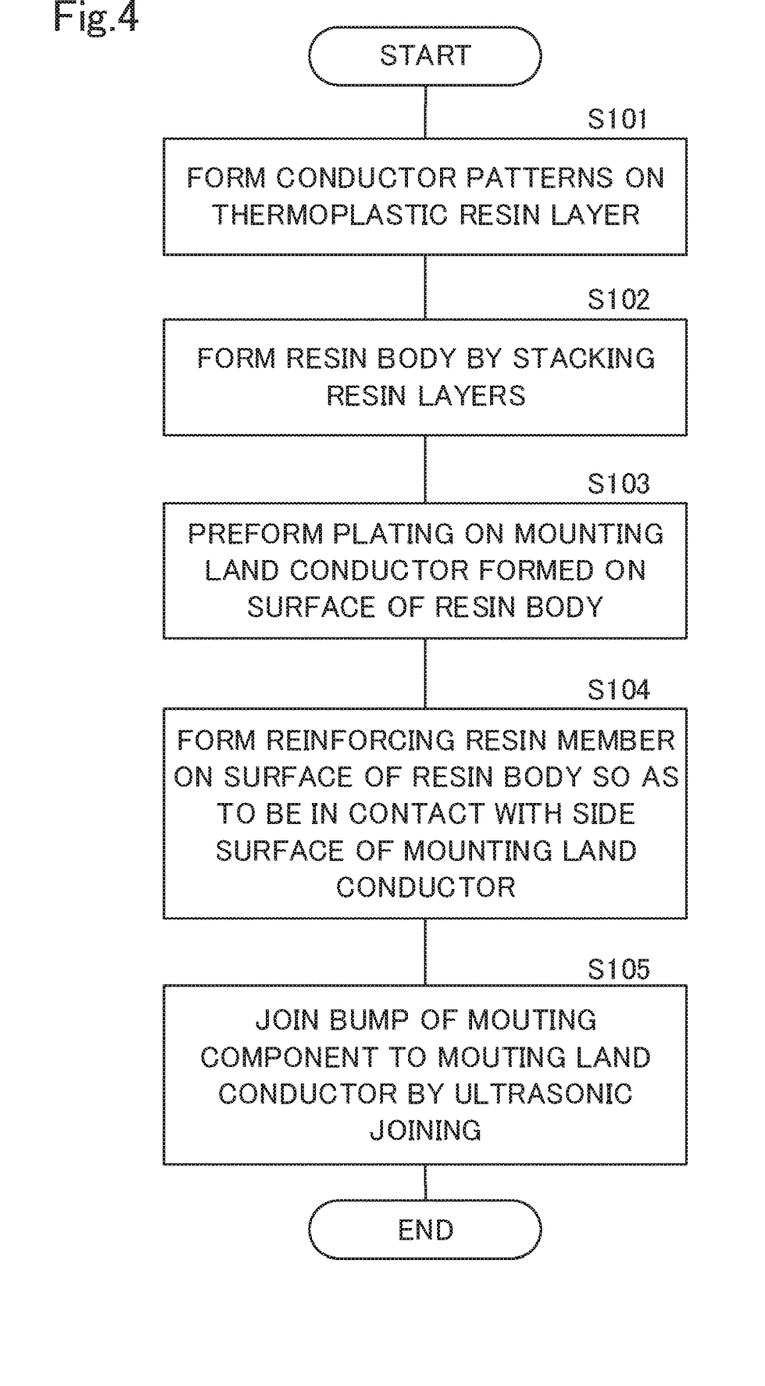
FIG. 4 is a flowchart illustrating a method of manufacturing the component-mounted resin substrate according to the first preferred embodiment of the present invention.

The component-mounted resin substrate 10, which has the above-described configuration, may preferably be manufactured by a method illustrated in FIG. 4. FIG. 4 is a flowchart illustrating a method of manufacturing the component-mounted resin substrate according to the first preferred embodiment of the present invention.

First, a plurality of thermoplastic resin layers are prepared, and conductor patterns are formed at required positions (S101). In this case, the mounting land conductors 221 are formed as conductor patterns on a surface of a resin layer being the uppermost layer of the resin body 21.

Next, the plurality of resin layers are stacked on top of one another so as to form the resin body 21 (S102). Then, plating is performed on the mounting land conductors 221 formed on the surface of the resin body 21 (S103). As the plating, for example, Ni/Au plating may preferably be performed.

Subsequently, the reinforcing resin members 231 are formed on the surface of the resin body 21 such that each of the reinforcing resin members 231 is in contact with the side surfaces of a corresponding one of the mounting land conductors 221 (S104). The reinforcing resin members 231 are formed by, for example, screen printing and heating. As a result, the resin substrate 20 is formed.

After that, the electronic component 30 is mounted on the resin substrate 20 by joining the bumps 31 to the corresponding mounting land conductors 221 by ultrasonic joining (S105). As a result, the component-mounted resin substrate 10 is formed.

Figure 5:
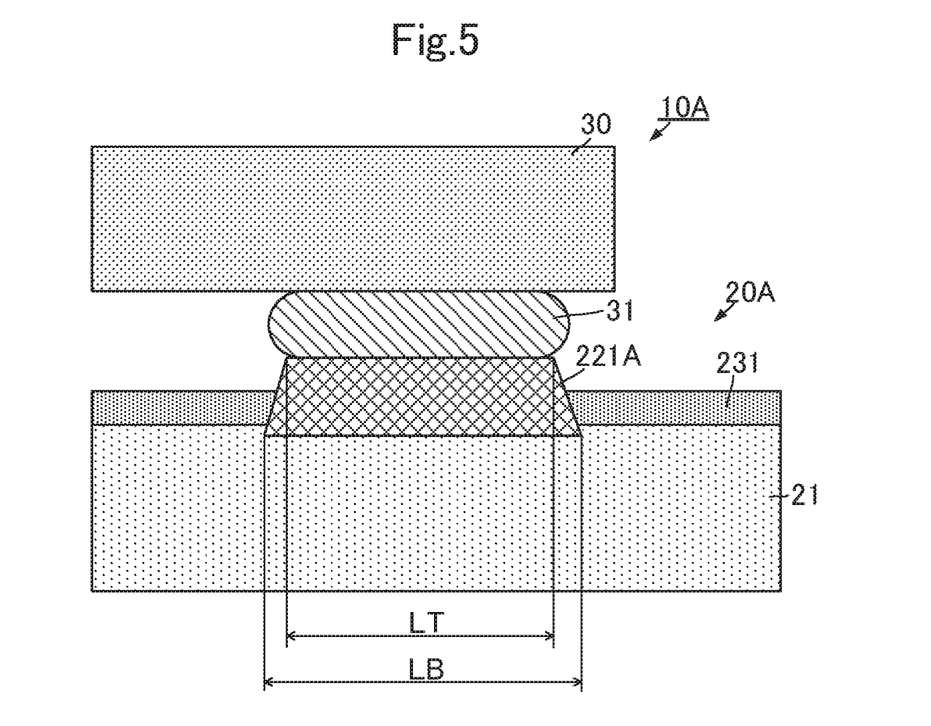
FIG. 5 is a partially enlarged sectional side view of a component-mounted resin substrate according to a second preferred embodiment of the present invention.

A resin substrate and a component-mounted resin substrate according to a second preferred embodiment of the present invention will now be described with reference to the drawings. FIG. 5 is a partially enlarged sectional side view of the component-mounted resin substrate according to the second preferred embodiment of the present invention.

The difference between a component-mounted resin substrate 10A according to the second preferred embodiment and the component-mounted resin substrate 10 according to the first preferred embodiment is the shapes of mounting land conductors 221A of a resin substrate 20A. The rest of the configuration of the component-mounted resin substrate 10A is the same or substantially the same as that of the component-mounted resin substrate 10 according to the first preferred embodiment, and repeated descriptions will be omitted.

A front surface of each of the mounting land conductors 221A (the surface to which one of the bumps 31 is to be joined) has an area smaller than that of a rear surface of the mounting land conductor 221A (the surface on the side of the resin body 21), and each of the mounting land conductors 221A has a tapered shape when viewed from the side. A portion of each of the mounting land conductors 221A on a side of the bottom surface is embedded in the resin body 21. With such a configuration, the contact area between each of the mounting land conductors 221A and a corresponding one of the reinforcing resin members 231 is larger than the contact area between each of the mounting land conductors 221 and the corresponding reinforcing resin member 231 described in the first preferred embodiment. This enables the mounting land conductors 221A to be fixed with more certainty, and the probability of the occurrence of a joint defect is further reduced.

Figure 6:
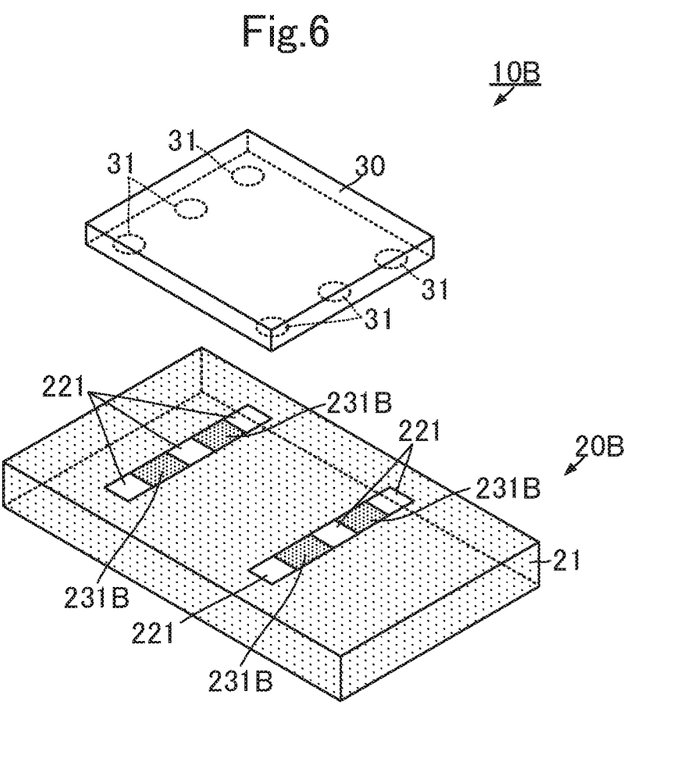
FIG. 6 is an exploded perspective view of a component-mounted resin substrate according to a third preferred embodiment of the present invention.

A resin substrate and a component-mounted resin substrate according to a third preferred embodiment of the present invention will now be described with reference to the drawings. FIG. 6 is an exploded perspective view of the component-mounted resin substrate according to the third preferred embodiment of the present invention.

The difference between a component-mounted resin substrate 10B according to the third preferred embodiment and the component-mounted resin substrate 10 according to the first preferred embodiment is the shapes of reinforcing resin members 231B. The rest of the configuration of the component-mounted resin substrate 10B is the same or substantially the same as that of the component-mounted resin substrate 10 according to the first preferred embodiment, and repeated descriptions will be omitted.

Each of the reinforcing resin members 231B is fills a space between two of the mounting land conductors 221 that are adjacent to each other on a surface of a resin substrate 20B. In other words, each of the reinforcing resin members 231B is in contact with side surfaces of two adjacent mounting land conductors 221, the side surfaces facing each other, and connects these side surfaces.

With such a configuration, the probability that the mounting land conductors 221 will be embedded into the resin body 21 or will become inclined is reduced, and the probability that the positional relationship between the mounting land conductors 221 that are adjacent to each other will change is also reduced. As a result, the bumps 31 are able to be joined to the corresponding mounting land conductors 221 in a state in which the arrangement pattern of the mounting land conductors 221 and the arrangement pattern of the bumps 31 of the electronic component 30 match each other. Therefore, the probability of the occurrence of a joint defect is further reduced.

Figure 7:
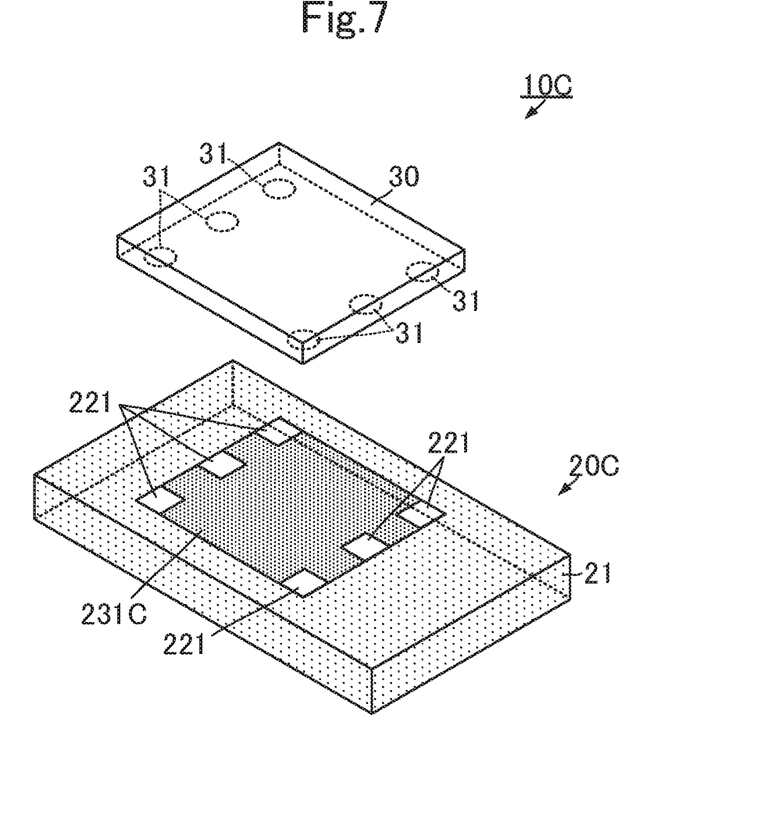
FIG. 7 is an exploded perspective view of a component-mounted resin substrate according to a fourth preferred embodiment of the present invention.

A resin substrate and a component-mounted resin substrate according to a fourth preferred embodiment of the present invention will now be described with reference to the drawings. FIG. 7 is an exploded perspective view of the component-mounted resin substrate according to the fourth preferred embodiment of the present invention.

The difference between a component-mounted resin substrate 10C according to the fourth preferred embodiment and the component-mounted resin substrate 10 according to the first preferred embodiment is the shape of a reinforcing resin member 231C. The rest of the configuration of the component-mounted resin substrate 10C is the same or substantially the same as that of the component-mounted resin substrate 10 according to the first preferred embodiment, and repeated descriptions will be omitted.

The reinforcing resin member 231C fills spaces between all of the mounting land conductors 221 on a surface of a resin substrate 20C.

With such a configuration, the probability that the mounting land conductors 221 will be embedded into the resin body 21 or will become inclined is reduced, and the probability that the positional relationship between all of the mounting land conductors 221 will change is also reduced. As a result, the bumps 31 are able to be joined to the corresponding mounting land conductors 221 in a state in which the arrangement pattern of the mounting land conductors 221 and the arrangement pattern of the bumps 31 of the electronic component 30 match each other with more certainty. Therefore, the probability of the occurrence of a joint defect is further reduced.

Figure 8:
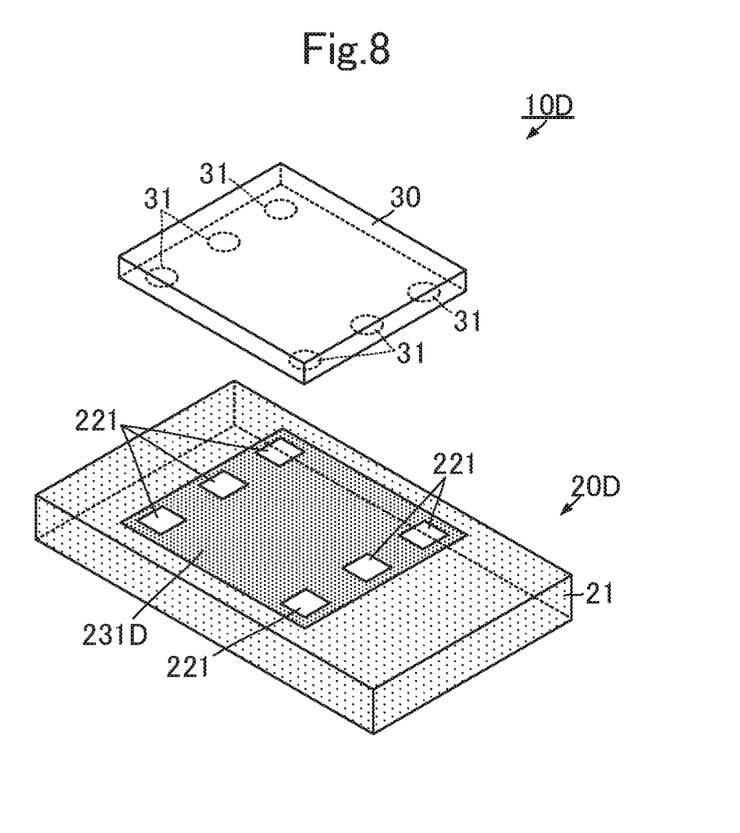
FIG. 8 is an exploded perspective view of a component-mounted resin substrate according to a fifth preferred embodiment of the present invention.

A resin substrate and a component-mounted resin substrate according to a fifth preferred embodiment of the present invention will now be described with reference to the drawings. FIG. 8 is an exploded perspective view of the component-mounted resin substrate according to the fifth preferred embodiment of the present invention.

The difference between a component-mounted resin substrate 10D according to the fifth preferred embodiment and the component-mounted resin substrate 10 according to the first preferred embodiment is the shape of a reinforcing resin member 231D. The rest of the configuration of the component-mounted resin substrate 10D is the same or substantially the same as that of the component-mounted resin substrate 10 according to the first preferred embodiment, and repeated descriptions will be omitted.

The reinforcing resin member 231D fills spaces between all of the mounting land conductors 221 on a surface of a resin substrate 20D and so as to be in contact with the side surfaces of all the mounting land conductors 221.

With such a configuration, the probability that the mounting land conductors 221 will be embedded into the resin body 21 or will become inclined is reduced, and the probability that the positional relationship between all of the mounting land conductors 221 will change is also reduced. In addition, as a result of all of the mounting land conductors 221 being fixed on all sides, the probability that the positions of the mounting land conductors 221 will change is also reduced. As a result, the bumps 31 are able to be joined to the corresponding mounting land conductors 221 in a state in which the arrangement pattern of the mounting land conductors 221 and the arrangement pattern of the bumps 31 of the electronic component 30 match each other with more certainty. Therefore, the probability of the occurrence of a joint defect is further reduced.

In this case, it is preferable that the external shape of the reinforcing resin member 231D and the external shape of the electronic component 30 be the same or substantially the same. In this case, the probability of the occurrence of a joint defect is reduced without making the surface of the resin substrate 20D unnecessarily hard. In other words, the probability of the occurrence of a joint defect is reduced with a minimum deterioration of the flexibility of the resin substrate 20D. Note that, although this advantageous effect is also able to be obtained by the component-mounted resin substrate 10C according to the fourth preferred embodiment, in the component-mounted resin substrate 10D according to the fifth preferred embodiment, the probability of the occurrence of a joint defect is further reduced, and the joint reliability is improved.

Figure 9:
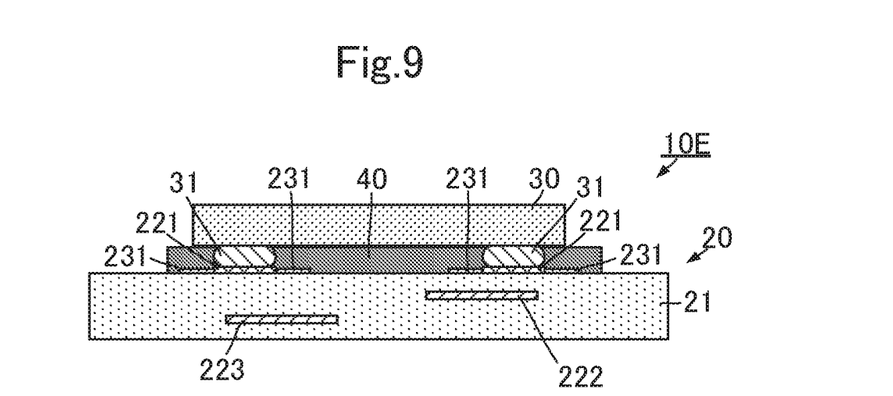
FIG. 9 is a sectional side view of a component-mounted resin substrate according to a sixth preferred embodiment of the present invention.

A component-mounted resin substrate according to a sixth preferred embodiment of the present invention will now be described with reference to the drawings. FIG. 9 is a sectional side view of the component-mounted resin substrate according to the sixth preferred embodiment of the present invention.

The difference between a component-mounted resin substrate 10E according to the sixth preferred embodiment and the component-mounted resin substrate 10 according to the first preferred embodiment is that an underfill resin 40 is added to the component-mounted resin substrate 10E. The rest of the configuration of the component-mounted resin substrate 10E is the same or substantially the same as that of the component-mounted resin substrate 10 according to the first preferred embodiment, and repeated descriptions will be omitted.

The underfill resin 40 includes a thermosetting resin. The underfill resin 40 is injected into a space between the bottom surface of the electronic component 30 (the surface on which the bumps 31 are provided) and the surface of the resin substrate 20 (the surface on which the mounting land conductors 221 and the reinforcing resin members 231 are provided). The underfill resin 40 is injected into the space between the bottom surface of the electronic component 30 and the surface of the resin substrate 20 and cured after the electronic component 30 has been joined to the resin substrate 20. Note that the underfill resin 40 may further include a filler made of an inorganic material, for example.

With such a configuration, the joint reliability between the bumps 31 and the corresponding mounting land conductors 221 is further improved.

Note that the configuration according to the sixth preferred embodiment may be applied not only to the component-mounted resin substrate 10 according to the first preferred embodiment, but also to the component-mounted resin substrates 10A to 10D according to the other preferred embodiments, and advantageous effects similar to those described above are able to be obtained.

Figure 10A:
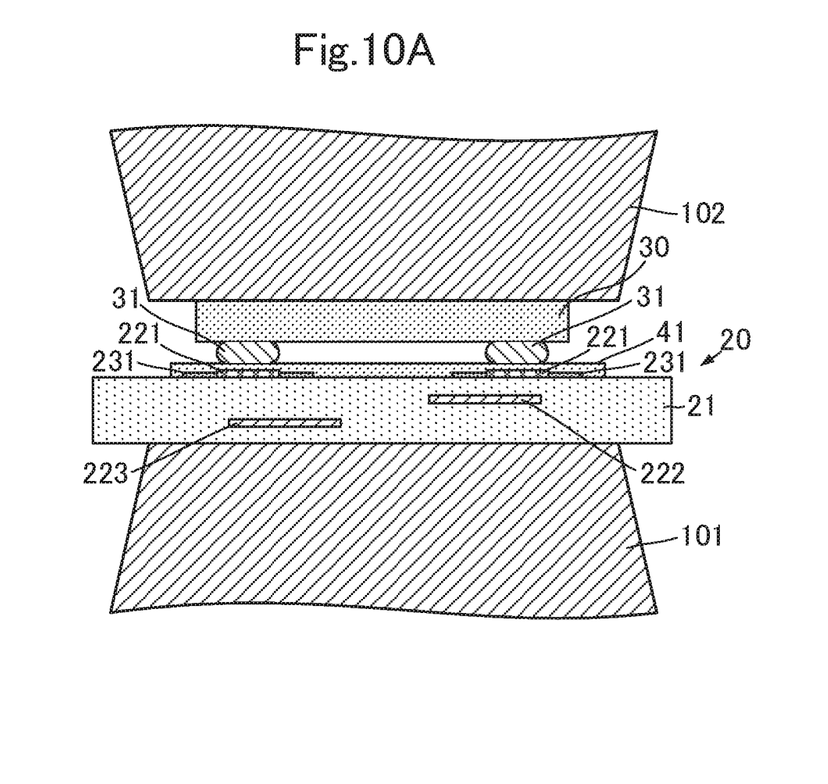
FIG. 10A is a sectional side view of a component-mounted resin substrate in a state of being manufactured according to a seventh preferred embodiment of the present invention.
Figure 10B:
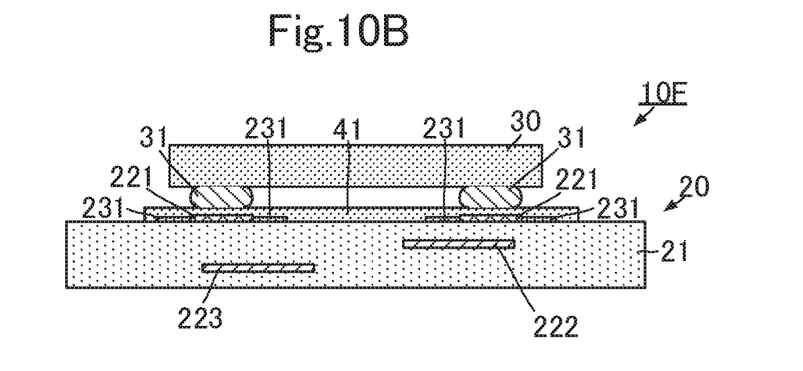
FIG. 10B is a sectional side view of the component-mounted resin substrate according to the seventh preferred embodiment of the present invention.

A component-mounted resin substrate according to a seventh preferred embodiment of the present invention will now be described with reference to the drawings. FIG. 10A is a sectional side view of the component-mounted resin substrate in a state of being manufactured according to the seventh preferred embodiment of the present invention, and FIG. 10B is a sectional side view of the component-mounted resin substrate according to the seventh preferred embodiment of the present invention.

A method of manufacturing a component-mounted resin substrate according to the seventh preferred embodiment preferably includes the steps illustrated in FIG. 4, and as step S105, instead of ultrasonic joining, bumps of an electronic component are joined to mounting land conductors with an anisotropic conductive film interposed therebetween. A specific process in step S105 according to the seventh preferred embodiment is as follows.

First, as illustrated in FIG. 10A, a portion of the surface (mounting surface) of the resin body 21, the portion covering the mounting land conductors 221 and reinforcing resin members 231, is covered with an anisotropic conductive film 41. The configuration of the resin body 21, excluding the anisotropic conductive film 41, is preferably the same or substantially the same as that described in the first preferred embodiment.

Next, the electronic component 30 is placed (stacked) on the resin body 21. The configuration of the electronic component 30 is preferably the same or substantially the same as that described in the first preferred embodiment.

After that, as illustrated in FIG. 10A, the resin body 21 and the electronic component 30 stacked one on top of the other are disposed between jigs 101 and 102 for hot pressing, and hot pressing is performed on the resin body 21 and the electronic component 30 at a predetermined temperature and a predetermined pressure by using the jigs 101 and 102.

A component-mounted resin substrate 10F that is illustrated in FIG. 10B is obtained through the process described above.

The above-described anisotropic conductive film (ACF) is a film formed by molding a material obtained by dispersing fine metal particles in a thermosetting resin into a film shape. As a result of performing the above-described hot pressing, plating layers of particles in the anisotropic conductive film, which is located between the mounting land conductors 221 and the bumps 31, are brought into contact with each other, so that a conductive path is provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   a resin body having thermoplasticity;
   a mounting land conductor provided on a side of a surface of the resin body; and
   a reinforcing resin member provided on the surface of the resin body so as to be in contact with at least a portion of a side surface of the mounting land conductor and having a height smaller than a height of the mounting land conductor; wherein
   the mounting land conductor has a tapered shape in which a bottom surface of the mounting land conductor has a width larger than a width of a top surface of the mounting land conductor when viewed from a side of the resin body; and
   a portion of the mounting land conductor on a side of the bottom surface is embedded in the resin body, and a portion of the mounting land conductor on a side of the top surface is not embedded in the resin body.

2. The resin substrate according to claim 1, wherein the reinforcing resin member is made of a material that is harder than the resin body.

3. The resin substrate according to claim 1, wherein
   the mounting land conductor includes a plurality of mounting land conductors that are spaced apart from each other; and
   the reinforcing resin member is in contact with portions of the side surfaces of adjacent mounting land conductors of the plurality of mounting land conductors, the portions facing each other.

4. The resin substrate according to claim 3, wherein the reinforcing resin member is provided on only a portion of the surface of the resin body, fills a space between all of the plurality of mounting land conductors at the surface of the resin substrate, and is in contact with entire side surfaces of all of the plurality of mounting land conductors.

5. The resin substrate according to claim 3, wherein the reinforcing resin member is provided on only a portion of the surface of the resin body, fills a space between all of the plurality of mounting land conductors at the surface of the resin body, and extends over an entire minimum region with corner portions or a portion of sides of the minimum region being defined by portions of the side surfaces of the plurality of mounting land conductors to which bumps of an electronic component are to be joined.

6. A resin substrate comprising:
   a resin body having thermoplasticity;
   a plurality of mounting land conductors provided on a surface of the resin body; and
   a reinforcing resin member that is provided on only a portion of the surface of the resin body so as to be in contact with at least a portion of a side surface of each of the mounting land conductors and that has a height smaller than a height of each of the mounting land conductors; wherein
   the plurality of mounting land conductors are spaced apart from each other; and
   the reinforcing resin member fills a space between all of the plurality of mounting land conductors on the surface of the resin body, and extends over an entire minimum region with corner portions or a portion of sides of the minimum region being defined by portions of the side surfaces of the plurality of mounting land conductors to which bumps of an electronic component are to be joined.

7. The resin substrate according to claim 6, wherein the reinforcing resin member is made of a material that is harder than the resin body.

8. A component-mounted resin substrate comprising:
   the resin substrate according to claim 1; and
   an electronic component including a bump that is ultrasonically joined to the mounting land conductor.

9. The component-mounted resin substrate according to claim 8, further comprising:
   an underfill resin that is located in a space between the electronic component and a surface of the resin substrate.

10. The component-mounted resin substrate according to claim 8, wherein the reinforcing resin member is made of a material that is harder than the resin body.

11. The component-mounted resin substrate according to claim 8, wherein
    the mounting land conductor includes a plurality of mounting land conductors that are spaced apart from each other; and
    the reinforcing resin member is in contact with portions of the side surfaces of adjacent mounting land conductors of the plurality of mounting land conductors, the portions facing each other.

12. The component-mounted resin substrate according to claim 11, wherein the reinforcing resin member is provided on only a portion of the surface of the resin body, fills a space between all of the plurality of mounting land conductors at the surface of the resin substrate, and is in contact with entire side surfaces of all of the plurality of mounting land conductors.

13. The component-mounted resin substrate according to claim 11, wherein the reinforcing resin member is provided on only a portion of the surface of the resin body, fills a space between all of the plurality of mounting land conductors at the surface of the resin body, and extends over an entire minimum region with corner portions or a portion of sides of the minimum region being defined by portions of the side surfaces of the plurality of mounting land conductors to which bumps of the electronic component are joined.

14. A component-mounted resin substrate comprising:
    the resin substrate according to claim 6; and
    an electronic component including a plurality of bumps that are ultrasonically joined to the plurality of mounting land conductors.

15. The component-mounted resin substrate according to claim 14, further comprising:

an underfill resin that is located in a space between the electronic component and a surface of the resin substrate.

16. The component-mounted resin substrate according to claim 13, wherein the reinforcing resin member is made of a material that is harder than the resin body.

17. A method of manufacturing a resin substrate comprising:
forming a mounting land conductor on a surface of one of a plurality of resin layers each having thermoplasticity, the mounting land conductor having a tapered shape in which a bottom surface of the mounting land conductor has a width larger than a width of a top surface of the mounting land conductor when viewed from a side;
forming a resin body in which a portion of the mounting land conductor on a side of the bottom surface is embedded and in which a portion of the mounting land conductor on a side of the top surface is not embedded, by stacking the plurality of resin layers on top of one another while the resin layer on which the mounting land conductor has been formed defines an uppermost layer; and
forming a reinforcing resin member on a surface of the resin body so as to be in contact with a side surface of the mounting land conductor and so as to have a height smaller than a height of the mounting land conductor.

18. A method of manufacturing a component-mounted resin substrate comprising:
forming a mounting land conductor on a surface of one of a plurality of resin layers each having thermoplasticity, the mounting land conductor having a tapered shape in which a bottom surface of the mounting land conductor has a width larger than a width of a top surface of the mounting land conductor when viewed from a side;
forming a resin body in which a portion of the mounting land conductor on a side of the bottom surface is embedded and in which a portion of the mounting land conductor on a side of the top surface is not embedded, by stacking the plurality of resin layers on top of one another while the resin layer on which the mounting land conductor has been formed defines an uppermost layer;
forming a reinforcing resin member on a surface of the resin body so as to be in contact with a side surface of the mounting land conductor and so as to have a height smaller than a height of the mounting land conductor; and
joining a bump of an electronic component to the mounting land conductor by ultrasonic joining.

19. A method of manufacturing a component-mounted resin substrate comprising:
forming a mounting land conductor on a surface of one of a plurality of resin layers each having thermoplasticity, the mounting land conductor having a tapered shape in which a bottom surface of the mounting land conductor has a width larger than a width of a top surface of the mounting land conductor when viewed from a side;
forming a resin body in which a portion of the mounting land conductor on a side of the bottom surface is embedded and in which a portion of the mounting land conductor on a side of the top surface is not embedded, by stacking the plurality of resin layers on top of one another while the resin layer on which the mounting land conductor has been formed defines an uppermost layer;
forming a reinforcing resin member on a surface of the resin body so as to be in contact with a side surface of the mounting land conductor and so as to have a height smaller than a height of the mounting land conductor; and
joining a bump of an electronic component to the mounting land conductor with an anisotropic conductive film interposed between the bump and the mounting land conductor.

* * * * *